United States Patent
Shi et al.

(10) Patent No.: US 12,112,946 B2
(45) Date of Patent: Oct. 8, 2024

(54) DEPOSITION OF HIGHLY CRYSTALLINE 2D MATERIALS

(71) Applicant: IMEC VZW, Leuven (BE)

(72) Inventors: Yuanyuan Shi, Leuven (BE); Benjamin Groven, Leuven (BE); Matty Caymax, Heverlee (BE)

(73) Assignee: IMEC VZW, Leuven (BE)

( * ) Notice: Subject to any disclaimer, the term of this patent is extended or adjusted under 35 U.S.C. 154(b) by 157 days.

(21) Appl. No.: 17/677,005

(22) Filed: Feb. 22, 2022

(65) Prior Publication Data

US 2022/0277953 A1    Sep. 1, 2022

(30) Foreign Application Priority Data

Mar. 1, 2021   (EP) .................................... 21159840

(51) Int. Cl.
| | |
|---|---|
| *H01L 21/02* | (2006.01) |
| *H01L 21/465* | (2006.01) |
| *H01L 29/24* | (2006.01) |
| *H01L 29/66* | (2006.01) |

(52) U.S. Cl.
CPC .... *H01L 21/0262* (2013.01); *H01L 21/02568* (2013.01); *H01L 21/02598* (2013.01); *H01L 21/02645* (2013.01); *H01L 21/465* (2013.01); *H01L 29/66969* (2013.01); *H01L 21/0242* (2013.01); *H01L 29/24* (2013.01)

(58) Field of Classification Search
CPC ........... H01L 21/0262; H01L 21/02568; H01L 21/02598; H01L 21/02645; H01L 21/465; H01L 29/66969; H01L 21/0242; H01L 29/24
See application file for complete search history.

(56) References Cited

U.S. PATENT DOCUMENTS

| | | |
|---|---|---|
| 9,502,298 B2 | 11/2016 | Tsai et al. |
| 11,037,783 B2 | 6/2021 | Li et al. |
| 2012/0295421 A1 | 11/2012 | Brabant et al. |
| 2014/0264636 A1 | 9/2014 | Tsai et al. |
| 2018/0163312 A1 | 6/2018 | Blomberg et al. |
| 2019/0109002 A1 | 4/2019 | Mattinen et al. |
| 2019/0279870 A1 | 9/2019 | Mane et al. |

(Continued)

FOREIGN PATENT DOCUMENTS

| | | |
|---|---|---|
| DE | 10 2019 114131 A1 | 3/2020 |
| WO | 2011/017339 A2 | 2/2011 |
| WO | 2019/158995 A2 | 8/2019 |

OTHER PUBLICATIONS

Daniele Chiappe et al., 2018 Nanotechnology , 29 425602 (Year: 2018).*

(Continued)

*Primary Examiner* — Julia Slutsker
(74) *Attorney, Agent, or Firm* — McDonnell Boehnen Hulbert & Berghoff LLP

(57) ABSTRACT

A method for providing a film of one or more monolayers of transition metal dichalcogenides on a substrate is disclosed. The method includes providing a substrate; depositing at least one monolayer of the transition metal dichalcogenides on the substrate; and selectively removing superficial islands on top of the at least one monolayer by thermal etching.

8 Claims, 6 Drawing Sheets

(56) References Cited

U.S. PATENT DOCUMENTS

2020/0312620 A1     10/2020   Blomberg et al.

OTHER PUBLICATIONS

Chipara et al, "Process Development for Reactive-Ion Etching of Molybdenum (MoS2) Utilizing a Poly(methyl methacrylate) (PMMA) Etch Mask," ARL-TR-8192 , Oct. 2017 (Year: 2017).*

Bauer, M., "High Throughput Selective Epitaxial Growth of in-situ Doped SiCP/SiP Layers for NMOS Devices Using a Si3H8/SiH3CH3/PH3/Cl-2 Based Cyclic Deposition and Etch Process", ECS Transactions, 2012, vol. 50(9), pp. 499-506.

Brent, J.R., et al., "Synthetic Approaches to Two-Dimensional Transition Metal Dichalcogenide Nanosheets", Progress in Materials Science, Jun. 10, 2017, vol. 89, pp. 411-473.

Kim, K.S., et al., "Atomic Layer Etching Mechanism of MoS2 for Nanodevices", ACS Appl. Mater. Interfaces, Mar. 17, 2017, vol. 9, pp. 11967-11976.

Lin, T., et al., "Controlled Layer-by-Layer Etching of MoS2", ACS Appl. Mater. Interfaces, Jun. 19, 2015, vol. 7(29), pp. 15892-15897.

Lu, X., et al., "Layer-by-Layer Thinning of MoS2 by Thermal Annealing", Nanoscale, Jan. 2013, vol. 5(19), pp. 8904-8908.

Wu, J., et al., "Layer Thinning and Etching of Mechanically Exfoliated MoS2 Nanosheets by Thermal Annealing in Air", Small, Aug. 28, 2013, vol. 9(19), pp. 3314-3319.

Zhang, R., et al., "Controlled Layer Thinning and p-Type Doping of WSe2 by Vapor XeF2", Adv. Funct. Mater., 2017, vol. 27, article 1702455, pp. 1-12.

Extended European Search Report, from the European Patent Office dated Jul. 30, 2021, for European Patent Application No. 21159840.4, pp. 1-11.

\* cited by examiner

DEPOSITION OF HIGHLY CRYSTALLINE 2D MATERIALS

CROSS-REFERENCE

The present application claims priority from European Patent application no. 21159840.4, filed on Mar. 1, 2021, which is incorporated by reference in its entirety.

FIELD OF THE DISCLOSURE

The disclosure relates to the field of metal chalcogenide films. More specifically, it relates to a method for forming providing a film of one or more monolayers of transition metal dichalcogenides on a substrate.

BACKGROUND OF THE DISCLOSURE

Two-dimensional transition metal dichalcogenide ($MX_2$) films attract lots of attention for next-generation electronics, optoelectronics and photonics. They could play an important role in beyond-CMoS (complementary metal-oxide-semiconductor) electronics.

The semiconducting group-VI $MX_2$ materials can possess a layered crystal structure with layer-dependent physical and electrical properties, and a chemically inert surface free of dangling bonds. As such, $MX_2$ materials can complement Silicon as channel material in nanoelectronic devices with ultra-scaled channel thickness at excellent electrostatic gate control and anticipated absence of interface defects, and decreased off-state power consumption. However, their unique properties can predominantly excel in one monolayer film and few monolayer film form, which fuels research on the large-area deposition of atomically thin $MX_2$ material.

The structural and electrical quality of two-dimensional transition metal dichalcogenide films (2D $MX_2$ films) can be highly dependent on the absence of defects and the smoothness of the film surface. The point defect, grin boundaries and surface roughness of 2D materials can make it more challenging for the integration and industrialization of 2D materials based nanoelectronics.

Towards the large-area integration of 2D materials based nanoelectronics, one of the biggest challenges can be to achieve uniform and wafer-scale single (or highly) crystalline deposition of the 2D $MX_2$ materials. The misorientation of the first monolayer crystals can result in grain boundaries, which is one kind of local defects that can degrade the advanced electronic properties of 2D materials.

There is therefore a need to achieve uniform and wafer-scale single (or highly) crystalline deposition of the 2D $MX_2$ materials.

SUMMARY OF THE DISCLOSURE

It is an object of embodiments of the present disclosure to provide a good method for providing a film of one or more monolayers of transition metal dichalcogenides on a substrate.

In embodiments of the present disclosure, this is achieved by a method in which first a substrate is provided and in which, furthermore, a sequence is provided which comprises the following steps:
  depositing at least one monolayer of the transition metal dichalcogenides on the substrate; and
  selectively removing superficial islands on top of the at least one monolayer by thermal etching.

In embodiments of the present disclosure, the sequence of depositing/selectively removing is executed at least twice. The sequence may be executed until one or more closed monolayers are obtained.

In embodiments of the present disclosure, etchants used for the etching may be selected from the group of $Cl_2$, HCl, and CO.

In embodiments of the present disclosure, the transition metal dichalcogenides can be deposited by metal-organic chemical vapor deposition.

A method, according to embodiments of the present disclosure, may be applied on any substrate, as long as the main growth mode of the $MX_2$ layer is planar, since it is based on the presence of dangling bonds on island edges, vs. a fully saturated basal plane surface. The substrate can be, for example, a sapphire substrate.

In embodiments of the present disclosure, the transition metal dichalcogenide is $MoS_2$. The disclosure is, however, not limited thereto. Also other transition metal dichalcogenides may be used, such as for example $WS_2$.

In embodiments of the present disclosure, the depositing and selective removing steps are done in a same reactor. In embodiments of the present disclosure, reactivation, which may be required when moving the substrate from one reactor to another, can be avoided by growing and etching in the same reactor.

In embodiments of the present disclosure, the selective removing can be done at a temperature of at least 500° C.

In embodiments of the present disclosure, the method is suitable for selective area deposition, wherein:
  the provided substrate is a patterned substrate comprising a first material and a second material,
  the at least one monolayer of the transition metal dichalcogenides is deposited on the patterned substrate and the materials are selected such that the deposition is more inhibited on the second material than on the first material, and
  the high temperature etching is such that nuclei of the transition metal dichalcogenides on the second material are removed from the second material.

In embodiments of the present disclosure, the transition metal is a metal from group VI of the periodic table of elements.

In embodiments of the present disclosure, a method is provided for manufacturing a field effect transistor. The method comprises providing a film of one or more monolayers of transition metal dichalcogenides on a substrate, using a method according to embodiments of the present disclosure.

The method, moreover, comprises forming a gate stack on top of the film of the transition metal dichalcogenides such that the film is a channel of the field effect transistor, and forming source and drain contacts at the beginning and end of the channel.

In embodiments of the present disclosure, MX2 materials replace Si as channel material. In embodiments of the present disclosure, the channel thickness can be reduced to a few or even one monolayer and that superficial islands are removed.

In embodiments of the present disclosure, the method comprises transferring the provided film from the substrate on which it is formed to a target substrate.

In summary, in embodiments of the present disclosure, by means of the (in-situ) selective etching process, an increased flexibility to tune the deposition process of epitaxial 2D $MX_2$ materials can be achieved. This enables controlling the local film thickness and thus surface smoothness and achieving uniform, wafer-scale and single (highly) crystalline 1 ML film of 2D $MX_2$ materials. The method according to embodiments of the present disclosure may, for example, be used for controlling the local film thickness variation of wafer-scale epitaxial 2D $MX_2$ materials and thus smoothening the surface. It may, for example, also be used for wafer-scale single (highly) crystalline growth of 2D $MX_2$ materials for advanced high-performance nanoelectronics and optoelectronics. Another application may be the anisotropic etching (with hard mask) techniques of 2D materials for nanoelectronics fabrication and integration.

Particular aspects of the disclosure are set out in the accompanying independent and dependent claims. Features from the dependent claims may be combined with features of the independent claims and with features of other dependent claims as appropriate and not merely as explicitly set out in the claims.

These and other aspects of the disclosure will be apparent from and elucidated with reference to the embodiment(s) described hereinafter.

Figure 1:
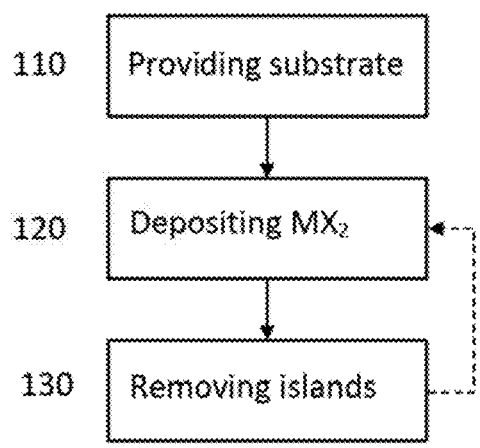
FIG. 1 shows a flow chart of an exemplary method in accordance with embodiments of the present disclosure.

Any reference signs in the claims shall not be construed as limiting the scope.

In the different drawings, the same reference signs refer to the same or analogous elements.

DETAILED DESCRIPTION OF ILLUSTRATIVE EMBODIMENTS OF THE DISCLOSURE

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the disclosure.

The terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the disclosure described herein are capable of operation in other sequences than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present disclosure, the only relevant components of the device are A and B.

Reference throughout this specification to "one embodiment" or "an embodiment" means that a particular feature, structure or characteristic described in connection with the embodiment is included in at least one embodiment of the present disclosure. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the disclosure, various features of the disclosure are sometimes grouped together in a single embodiment, figure, or description thereof for the purpose of streamlining the disclosure and aiding in the understanding of one or more of the various disclosed aspects. This method of disclosure, however, is not to be interpreted as reflecting an intention that the claimed disclosure requires more features than are expressly recited in each claim. Rather, as the following claims reflect, disclosed aspects lie in less than all features of a single foregoing disclosed embodiment. Thus, the claims following the detailed description are hereby expressly incorporated into this detailed description, with each claim standing on its own as a separate embodiment of this disclosure.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

In the description provided herein, numerous specific details are set forth. However, it is understood that embodiments of the disclosure may be practiced without these specific details. In other instances, well-known methods, structures and techniques have not been shown in detail in order not to obscure an understanding of this description.

In embodiments of the present disclosure where reference is made to a monolayer ML, the reference is made to a layer of transition metal dichalcogenides ($MX_2$, with M a transition metal, and X a chalcogen).

In embodiments of the present disclosure where reference is made to an $MX_2$ film, the reference is made to a film on a substrate, composed of one or more monolayers of $MX_2$.

In embodiments of the present disclosure, the thickness of a monolayer depends on the transition metal M and on the chalcogenide X. This thickness is typically around 0.6 nm.

In embodiments of the present disclosure where reference is made to the number of monolayers (NOML), the reference is made to the number of monolayers stacked on top of each other.

The total film thickness is the physical thickness of the provided $MX_2$ film. It depends on the NOML and on the transition metal M and on the chalcogenide X. For example a $MX_2$ film containing exactly 2 MLs of $MX_2$ is designated as a "2 ML film" and a $MX_2$ film of exactly 1 ML is designated as a "1 ML film or single ML film".

Embodiments of the present disclosure relate to a method 100 for providing a film of one or more monolayers of transition metal dichalcogenides on a substrate. The method comprises:
  providing 110 a substrate;
the method, furthermore, comprises a sequence of:
  depositing 120 at least one monolayer of the transition metal dichalcogenides on the substrate, and
  selectively removing 130 superficial islands on top of the at least one monolayer by thermal etching.

A flow chart of an exemplary method in accordance with embodiments of the present disclosure is shown in FIG. 1.

In embodiments of the present disclosure, the superficial islands are removed. Without being bound by theory, it is assumed that this is possible because of a different etch rate between the superficial islands on the monolayer, and the monolayer itself. It is assumed that the reason therefore is that the etchants first react at the edges of the $MX_2$ islands or $MX_2$ flakes due to existence of dangling bonds, rather than the planar surface which is free of dangling bonds. In embodiments of the present disclosure the etching reaction is, therefore, not conformal, but rather selective to superficial islands.

In embodiments of the present disclosure, a basal plane of the film is parallel with a surface of the wafer.

In embodiments of the present disclosure, a monolayer of transition metal dichalcogenides may be a one-molecular 2D layer of transition metal dichalcogenides ($MX_2$, with M a transition metal, and X a chalcogen), with its basal plane parallel aligned to the wafer surface, and containing only one central layer of M-atoms, cladded above and below by a layer of X atoms.

In embodiments of the present disclosure, selective removal of the superficial islands on top of the at least one monolayer may be done by thermal etching, whereby etchants such as $Cl_2$, HCl or CO are used.

In embodiments of the present disclosure, a setup may be used that allows the growth and etching process of 2D $MX_2$ in the same reactor. With such a setup, it is possible to etch away the undesirable superficial $MX_2$ islands in-situ and selectively after the growth, and thus smoothing the surface of $MX_2$.

In embodiments of the present disclosure, the selective etching process can be gentle and doesn't modify the physical properties of 2D materials, which actually improves the electrical performance of $MX_2$ based transistors in terms of minimum current (i.e. the off-current, Imin) and subthreshold swing (SSmin).

In embodiments of the present disclosure, the depositing/selectively removing sequence 120, 130 may be executed at least twice.

It is, thereby, beneficial that the number of monolayers, and the variation thereon, can be controlled by executing cycles of growth and etching. Thus, a smoothened surface can be obtained. In embodiments of the present disclosure, it is possible to selectively etch the superficial islands without damaging the underneath closed layers. When reference is made to a closed layer, reference is made to a layer without an opening in the layer. A closed layer, on the other hand, is a fully coalesced layer without any holes/openings.

By combining cycles of the selective etching process with cycles of deposition, the deposition of uniform and wafer-scale single (highly) crystalline one monolayer $MX_2$ film can be achieved. A method according to embodiments of the present disclosure can enable precise control of 2D film thickness and thus surface smoothness. Moreover, it can also provide new methods for the nanofabrication and integration process of 2D materials based nanoelectronics and optoelectronics.

The total film thickness can be controlled through tuning parameters of the growth process, such as the growth time. Moreover, a selective and gentle etching process, according to embodiments of the present disclosure, after growth, helps to etch away the superficial islands without damaging the lower-lying closed 2D layer(s).

Figure 2:
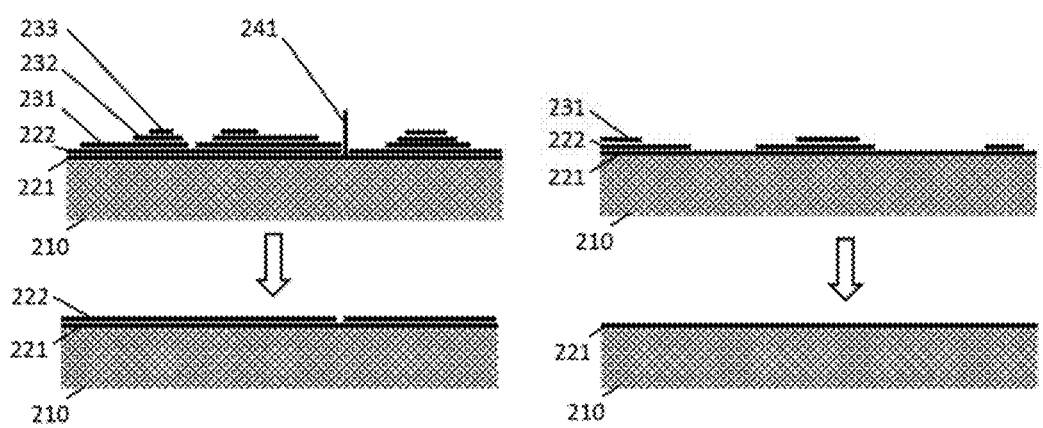
FIG. 2 schematically illustrate one cycle of growth and selective etching on wafer-scale epitaxial 2D materials, in accordance with embodiments of the present disclosure.

The drawings in FIG. 2 schematically illustrate one cycle of growth and selective etching on wafer-scale epitaxial 2D materials. The top drawings in FIG. 2 show a schematic drawing of a stack of monolayers 221-222, 231-233, including superficial islands, on a deposition substrate 210. As illustrated in the top drawings of FIG. 2, unwanted superficial islands 231-233 are existing on top of the lower-lying, closed 2D 1 ML film 221 of multi-ML film 221, 222 after the growth, even though the deposition the deposition time is precisely controlled. Also a vertical 2S crystal 241 is grown at a discontinuity in the second monolayer 222. The superficial islands are grown anisotropically on top of the lower lying layer(s) before the underlying layer(s) is closed. Therefore, in embodiments of the present disclosure, a thermal etching process is applied directly after the growth.

This etching process should be gentle and can remove the superficial islands selectively. The selectivity of the etching process can be engineered by a judicious choice of the species of the etchants, and careful tuning of process parameters such as temperature, pressure, gas flow, time, etc. In embodiments of the present disclosure, etchants used for the etching 130 may be, for example, selected from the group of $Cl_2$, HCl, CO. This group is not limiting and also other etchants may be selected. In embodiments of the present disclosure, the selective removing 130 can be generally done at temperatures of at least 500° C. The temperatures generally range between 500° C. and 600° C. In embodiments of the present disclosure, the cycle of growth and etching can help to reduce the local NOML variation of the deposited 2D layers and thus smooth the surface. In FIG. 2, the schematic drawings at the bottom show the obtained stack after selective etching.

Without being bound by theory, it is assumed that the reaction kinetics of the etchants (such as $Cl_2$, HCl, CO, etc.) with 2D superficial islands is different from the reaction kinetics of fully closed layers of 2D materials. The etchants firstly attack the edges of 2D islands due to the existence of dangling bonds, rather than the planar surface which is free of dangling bonds.

In embodiments of the present disclosure, defects during the etching process may be avoided by the addition of $H_2S$ (or other sulphur-containing precursors) during the etching process.

In an exemplary embodiment of the present disclosure, firstly, epitaxial molybdenum disulfide ($MoS_2$) can be deposited 120 on sapphire wafers 210 through metal-organic chemical vapor deposition (MOCVD) in an industry-compatible reactor. The sapphire wafers 210 can be firstly placed on a 200 mm silicon pocket wafer (structure: 100 nm ALD $Al_2O_3$/2000 nm $SiO_2$/Si) which contains 4 pockets with size of 2-inch and then loaded to the MOCVD reactor. The MOCVD equipment for the experiment can consist of a single wafer (z 200 mm) and lamp-heated reactor with gas flow controlled by mass flow controllers, which can allow large-scale deposition of $MX_2$ on wafers with size as large as 200 mm. After loading the sapphire wafers to the reactor, the wafers can be heated to 1000° C. under high-purity $N_2$ in the reactor, then 100 standard cubic centimeter per minute (sccm) $H_2S$ (carried by 20 standard liter per minute (slm) $N_2$) and 80 sccm Ar:$Mo(CO)_6$ gas precursor (Ar is the carrier gas for the metal precursor) can be sent to the reactor. High purity $H_2S$, $N_2$ and Ar gas can be provided through compressed gas cylinders. The $Mo(CO)_6$ can be vaporized from the solid precursor in a metallic canister (from Air liquide) at about 26° C. under about 900 mbar. During the growth, the growth temperature can be kept at 1000° C. and the total pressure is constant at 20 Torr. For the growth of 1-2 ML (1 ML film with 2nd ML islands) and 3-5 ML (3 ML film with 4th and 5th ML islands) films of $MoS_2$ on sapphire, the growth time can be 6 min and 20 min respectively at this condition.

After the growth, the etching process can follow immediately in the same reactor. The etching process can be performed under the condition of 20 sccm $Cl_2$ and 20 slm $N_2$ at a total pressure of 20 Torr. The temperature for the etching process can be constant. Two kinds of temperature conditions may be tried, including 600° C. and 500° C. After the etching process, all the samples can be annealed in the same chamber under 100 sccm $H_2S$ (carried by 20 slm $N_2$) at 1000° C. and at a total pressure of 90 Torr.

Figure 3:
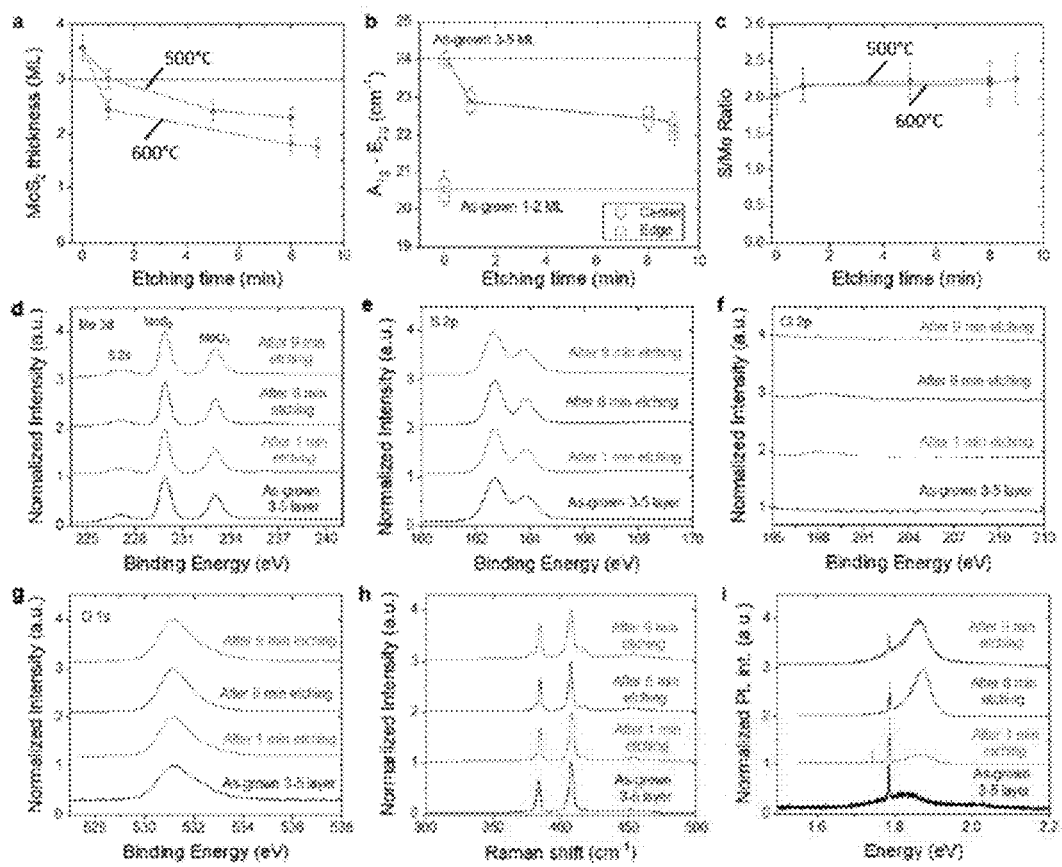
FIG. 3, parts a to l, illustrates physical properties of a $MoS_2$ film obtained using a method in accordance with embodiments of the present disclosure. (a) thickness of 3-5 ML $MoS_2$ before etching and after different etching times at different temperatures; (b) $A_{1g}$ and $E_{2g}$ peak frequency difference of 3-5 ML $MoS_2$ before and after etching, and as-grown 1-2 ML $MoS_2$; (c) S/Mo ratio of 3-5 ML $MoS_2$ before etching and after different etching times at different temperatures; (d) X-ray photoelectron spectroscopy (XPS) of Mo 3d before etching and after different etching times; (e) XPS of S 2p before etching and after different etching times; (f) XPS of Cl 2p before etching and after different etching times; (g) XPS of O 1s before etching and after different etching times; (h) Raman spectroscopy of 3-5 ML $MoS_2$ before etching and after different etching times; (i) Photoluminescence (PL) spectrum of 3-5 ML $MoS_2$ before etching and after different etching times.

The selective etching of epitaxial $MoS_2$ grown on sapphire through in-situ $Cl_2$ thermal etching is demonstrated in FIG. 3, parts a to i.

The graphs show:
(a) thickness of 3-5 ML $MoS_2$ before etching and after different etching times at different temperatures;
(b) $A_{1g}$ and $E_{2g}$ peak frequency difference of 3-5 ML $MoS_2$ before and after etching, and as-grown 1-2 ML $MoS_2$;
(c) S/Mo ratio of 3-5 ML $MoS_2$ before etching and after different etching times at different temperatures;
(d) X-ray photoelectron spectroscopy (XPS) of Mo 3d before etching and after different etching times;
(e) XPS of S 2p before etching and after different etching times;
(f) XPS of Cl 2p before etching and after different etching times;
(g) XPS of O 1s before etching and after different etching times;
(h) Raman spectroscopy of 3-5 ML $MoS_2$ before etching and after different etching times;
(i) Photoluminescence (PL) spectrum of 3-5 ML $MoS_2$ before etching and after different etching times.

The temperature of etching process was constant at 600° C. for FIG. 3, parts b, and d-i.

The total film thickness of the as-grown 3-5 ML $MoS_2$ film on sapphire is around 3.6 ML as calculated from Rutherford backscattering spectrometry (RBS) measurements. The $Cl_2$ etching speed of the as-grown 3.6 ML $MoS_2$ is evaluated at various etching temperatures, including 500° C. and 600° C. in FIG. 3, part a. The etching speed increases with the etching temperature. Most importantly, the etching speed which is initially quite high (0.5-1 ML/minute depending on the temperature), decreases after some time of etching to ~0.1 ML/minute (the slope in FIG. 3, part a, gets less steep with the etching time), indicating etching of the closed layers is much more difficult than the superficial islands. This allows a selective etching of the superficial islands without damaging the underneath closed layer(s). The etching selection ratio can be optimized through different etchants, temperature, pressure, gas flow, time and others.

FIG. 3, part b, further illustrates the selective etching through the $A_{1g}$ and $E_{2g}$ peak frequency difference of the 3-5 ML $MoS_2$ before and after different etching time at 600° C. The $A_{1g}$ and $E_{2g}$ peak frequency difference of $MoS_2$ decreases with the film thickness, as it can be observed for as grown 3-5 ML and 1-2 ML $MoS_2$. Similar to that in FIG. 3, part a, $A_{1g}$ and $E_{2g}$ peak frequency difference decreases with the etching time and the decreasing slope becomes gentle with the etching time.

This $Cl_2$ thermal etching process can be gentle, which doesn't change the pristine properties of the as grown $MoS_2$ on sapphire. The measured S/Mo ratio stays around 2 for the $MoS_2$ after different etching times at both 500° C. and 600° C., as illustrated in FIG. 3, part c.

Furthermore, the XPS spectra of the Mo 3d, S 2p and O 1s all stay the same before and after 1 min, 8 min and 9 min etching in FIG. 3, parts e and g.

Meanwhile, the XPS spectra of Cl 2p show negligible peaks for the $MoS_2$ before and after 1 min, 8 min and 9 min etching in FIG. 3, part f, indicating no Cl bonds with the $MoS_2$ after etching.

The characteristic peaks all exist in Raman and PL spectra for the $MoS_2$ after different etching time in FIG. 3, parts h-i. The slightly shift of the peak position in FIG. 3, part l, is due to the thickness reduction with the etching time. According to all of these physical characterizations of the epitaxial $MoS_2$ grown on sapphire before and after different etching time, the etching process doesn't change the pristine physical properties of the as-grown $MoS_2$.

Figure 4:
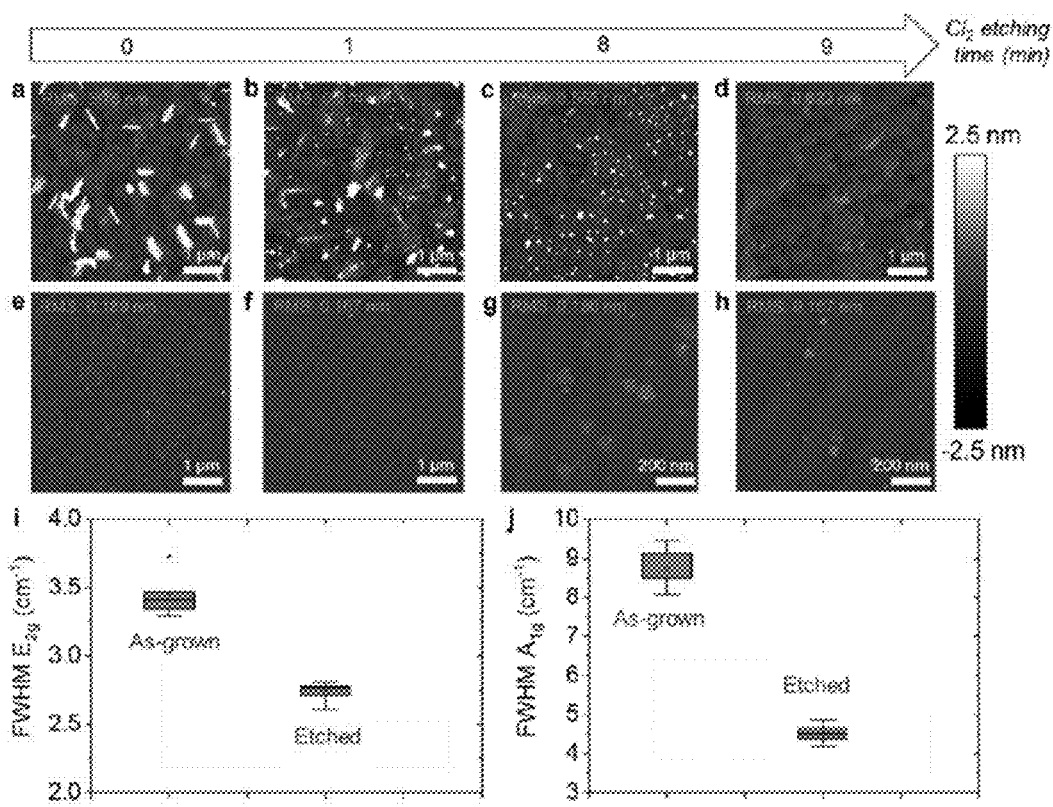
FIG. 4, parts a to j, illustrates the surface smoothness of an epitaxial $MoS_2$ film before and after etching, illustrates that surface smoothness can be achieved using a method in accordance with embodiments of the present disclosure. Parts a-d show the topography obtained using AFM (atomic force microscopy) of as-grown 3-5 ML $MoS_2$ (part a) and the topography obtained after different etching times (parts b-d). Parts e-f, show the topography obtained using AFM of as-grown 1-2 ML $MoS_2$ before (part e) and after 0.5 min of etching (part f). Parts g-h show the zoom in topography maps of parts e-f. The surface coverage of superficial crystals (parts e and g) is around 5%, while it reduces to <1% in (parts f and h). Part i shows the full width at half maximum (FWHM) of the $E_{2g}$ peak of the as-grown 1-2 ML $MoS_2$ and the one after 0.5 min etching. Part j shows the full width at half maximum (FWHM) of the $A_{1g}$ peak of the as-grown 1-2 ML $MoS_2$ and the one after 0.5 min etching.

When providing a film using the exemplary method, in accordance with embodiments of the present disclosure, FIG. 4 illustrates that surface smoothness of the epitaxial $MoS_2$ on sapphire after $Cl_2$ etching can be achieved. This is illustrated for 3-5 ML and 1-2 ML $MoS_2$ on sapphire after $Cl_2$ etching.

FIG. 4, parts a-d, show the topography obtained using AFM (atomic force microscopy) of as-grown 3-5 ML $MoS_2$ (FIG. 4a) and the topography obtained after different etching times (FIG. 4, parts b-d).

FIG. 4, parts e-f, show the topography obtained using AFM of as-grown 1-2 ML $MoS_2$ before (FIG. 4, part e) and after 0.5 min of etching (FIG. 4, part f).

FIG. 4, parts g-h, shows the zoom in topography maps of FIG. 4, parts e-f. The surface coverage of superficial crystals in (FIG. 4, parts e, g) is around 5%, while it reduces to <1% in (FIG. 4, parts f, h).

FIG. 4, part i, shows the full width at half maximum (FWHM) of the $E_{2g}$ peak of the as-grown 1-2 ML $MoS_2$ and the one after 0.5 min etching.

FIG. 4, part j, shows the full width at half maximum (FWHM) of the $A_{1g}$ peak of the as-grown 1-2 ML $MoS_2$ and the one after 0.5 min etching.

Both peaks are narrowing after etching. The temperature of etching process is constant at 600° C.

As mentioned above, the as-grown 3-5 ML $MoS_2$ comprises a closed film of 3 MLs of $MoS_2$ with 4th ML, 5th ML crystals and vertical growth on top (FIG. 4, part a). The surface roughness of this as-grown 3-5 ML $MoS_2$ is around 5.76 nm. With the $Cl_2$ etching process, the vertical growth, the $5^{th}$ and $4^{th}$ ML crystals disappear (FIG. 4, parts b-d). Moreover, the surface roughness also decreases (FIG. 4, parts b-d). These observations are further confirmed for the etching of as-grown 1-2 ML $MoS_2$ film (FIG. 4, parts e-h). There is a clear reduction for surface coverage of superficial crystals on top of the closed monolayer $MoS_2$ before and after 0.5 min etching process (from ~5% in FIG. 4, parts e and g, to <1% in FIG. 4, parts f and h. Meanwhile, the size of the superficial crystals also decreases after etching (FIG. 4, parts g-h). As a result, the whole surface roughness decreases. Moreover, the $E_{2g}$ and $A_{1g}$ peaks of the 1-2 ML $MoS_2$ become narrower after etching, indicating the sample surface after etching is more uniform.

Embodiments of the present disclosure provide a method for manufacturing a field effect transistor. The method comprises providing 100 a film of one or more monolayers of transition metal dichalcogenides on a substrate, using a method according to any of the previous claims. The method, moreover, comprises forming a gate stack on top of the film of the transition metal dichalcogenides such that the film is a channel of the field effect transistor, and forming source and drain contacts at the beginning and end of the channel.

Figure 8:
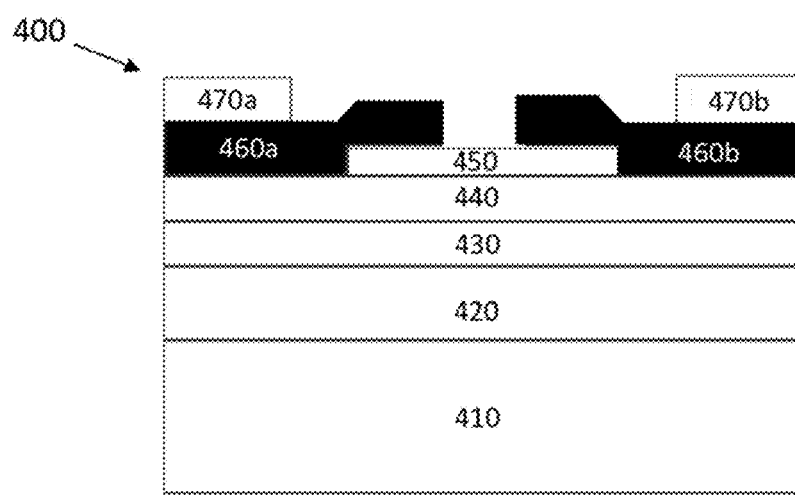
FIG. 8 shows a schematic drawing of a FET stack wherein the channel is an $MX_2$ channel which is obtained using a method in accordance with embodiments of the present disclosure.

FIG. 8 shows a schematic drawing of an exemplary FET stack obtained using a method in accordance with embodiments of the present disclosure. The stack 400 comprises a Si substrate 410, a $SiO_2$ layer 420, a first metal layer 430, a high-k dielectric 440, an $MX_2$ channel 450, source and drain contacts 460a of a second metal, 460b, and metal contacts (of a third metal) 470a and 470b with the source and drain contacts. This is only an exemplary FET stack, and also other FET stacks known by the person skilled in the art are possible. The channel is a $MX_2$ channel obtained using a method in accordance with embodiments of the present disclosure.

In the following paragraphs, physical properties of pristine and etched 3-5 layer $MoS_2$ based field effect transistors are evaluated.

The electrical properties of epitaxial $MoS_2$ after etching further confirm that the $Cl_2$ thermal etching process doesn't damage the closed $MoS_2$ layers under the superficial islands, and there is no doping effect induced by the $Cl_2$ etching. The typical transfer characteristic curves of pristine (reference numbers 1 and 2) and etched 3-5 layer $MoS_2$ (reference numbers 3 and 4) based field-effect transistors (FETs) in FIG. 5 reveal that there is no shift of the threshold voltage ($V_t$) for the $Cl_2$ etched $MoS_2$ based transistors at all the channel lengths ($L_{ch}$), compared to that of pristine $MoS_2$ based transistors. This indicates there is no doping effect introduced by this $Cl_2$ thermal etching process. Moreover, the minimum drain current (Imin) of the pristine $MoS_2$ based transistors is larger than that of etched $MoS_2$ based transistors at all the $L_{ch}$.

Figure 6:
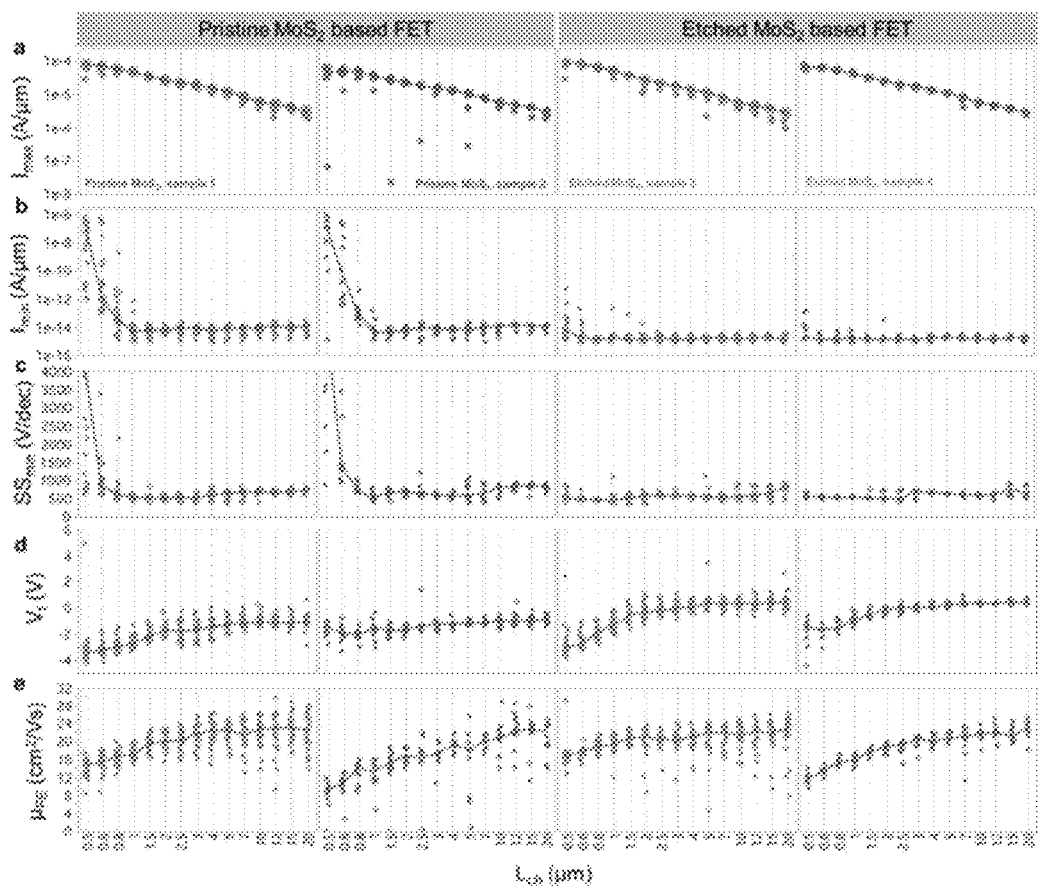
FIG. 6, parts a to e, shows the electrical performance of pristine $MoS_2$ based FETs and of etched $MoS_2$ based FETs, the latter being obtained using a method in accordance with embodiments of the present disclosure. Parts a-e show the statistical comparison of the electrical properties of pristine and etched $MoS_2$ based transistors. From top to bottom the following graphs are shown: part a: Imax; part b: Imin; part c SSmin; part d: Vt; and part e: $\mu_{FE}$. The transistors are fabricated on 3-5 ML $MoS_2$ before (samples with reference numbers 1 and 2; the two left columns) and after 9 min $Cl_2$ etching (samples with reference numbers 3 and 4; the two right columns.

This is further confirmed in FIG. 6, parts a-e, through comparing the electrical performance of 1080 transistors fabricated with the pristine and etched $MoS_2$ layers. FIG. 6, parts a-e, shows the statistical comparison of the electrical properties of pristine and etched $MoS_2$ based transistors. From top to bottom the following graphs are shown:

(a) Imax;
(b) Imin;
(c) SSmin;
(d) Vt;
(e) $\mu_{FE}$.

The transistors are fabricated on 3-5 ML $MoS_2$ before (samples with reference numbers 1 and 2; the two left columns) and after 9 min $Cl_2$ etching (samples with reference numbers 3 and 4; the two right columns.

The maximum drain current (Imax) of the etched $MoS_2$ based transistors does not decrease in FIG. 6, part a, compared to that of the pristine $MoS_2$ based transistors. This confirms that the $Cl_2$ thermal etching process is gentle, which doesn't damage the closed $MoS_2$ layers under the superficial crystals.

Figure 5:
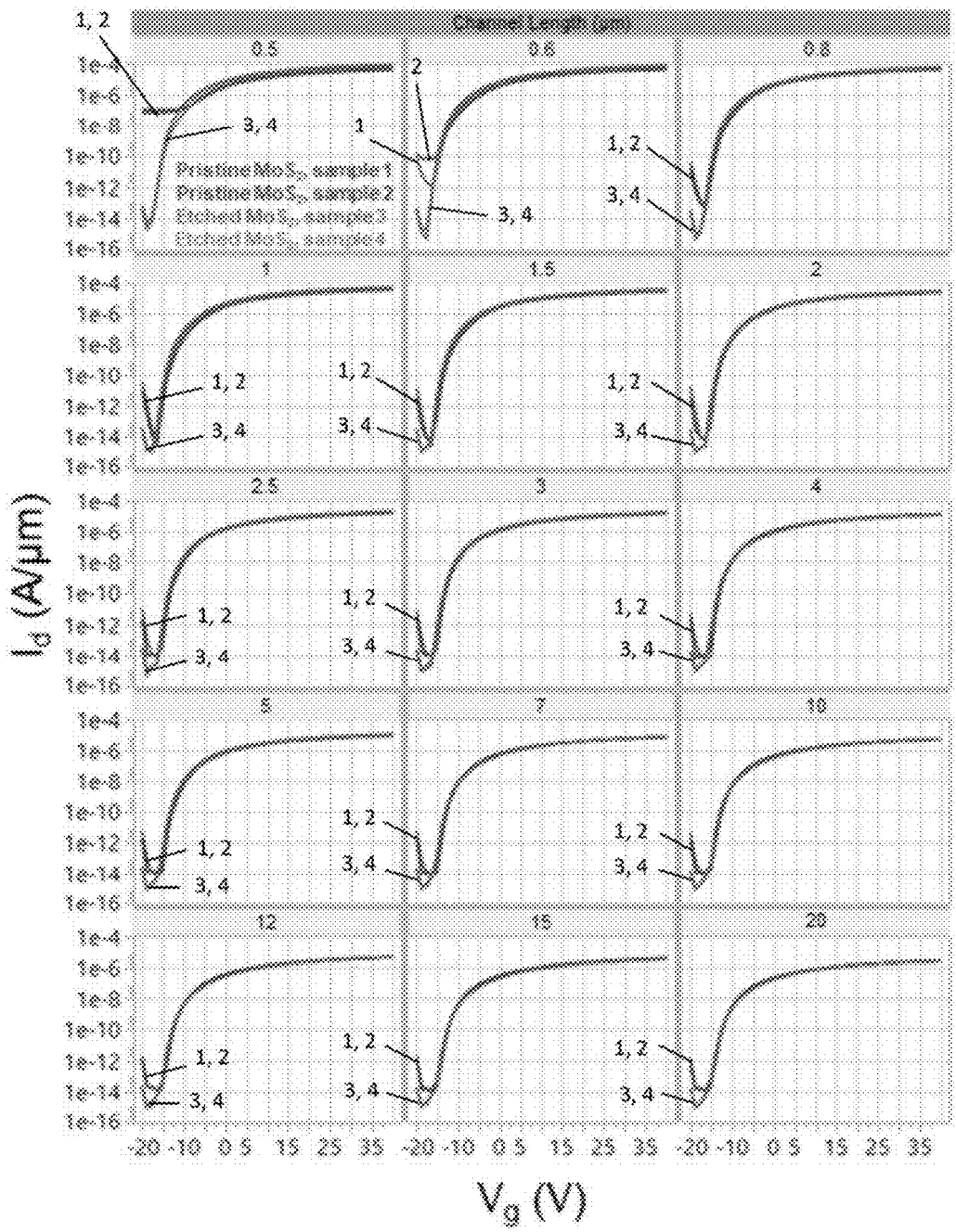
FIG. 5 shows the transfer curves of pristine and etched 3-5 layer $MoS_2$ based field effect transistors, the latter being obtained using a method in accordance with embodiments of the present disclosure.

Similar to FIG. 5, FIG. 6, part b, shows that the Imin of the pristine $MoS_2$ based transistors is larger than that of the etched $MoS_2$ based transistors, especially for transistors with shorter $L_{ch}$.

A similar phenomenon is also observed for minimum subthreshold swing (SSmin). As can be seen in FIG. 6, part c, the SSmin of the pristine $MoS_2$ based transistors is larger than that of the etched $MoS_2$ based transistors, especially for transistors with shorter $L_{ch}$.

From the graphs in FIG. 6, part d, it can be seen that the threshold voltage $V_t$ of the pristine and the etched $MoS_2$ based transistors is substantially the same, further confirming that the $Cl_2$ thermal etching doesn't introduce any doping to the $MoS_2$ layers. The calculated field effect mobility (μFE) of the pristine and etched $MoS_2$ based transistors is similar, further confirming that the $Cl_2$ thermal etching doesn't damage the $MoS_2$ layers under the superficial crystals. Thus, this in-situ Cl$_2$ thermal etching process can be gentle and can etch the superficial crystals on top of the closed 2D layers selectively.

Figure 7:
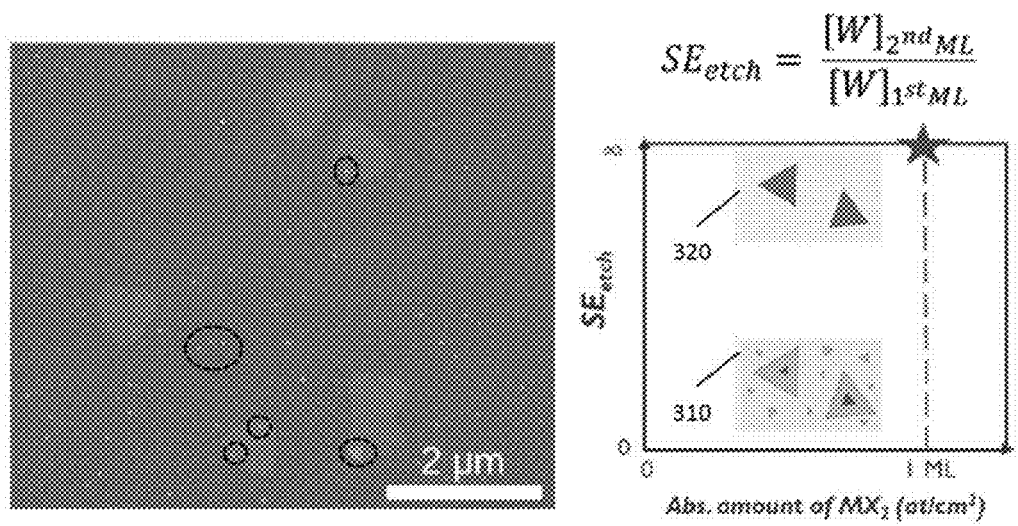
FIG. 7 shows an image of MOCVD $WS_2$ crystals grown on a $SiO_2$/Si surface and a graph illustrating the effect of the etching selection ratio on the film obtained using a method in accordance with embodiments of the present disclosure.

As discussed earlier, in embodiments of the present disclosure, a uniform and wafer-scale single (or highly) crystalline epitaxial deposition of single monolayer 2D materials can be obtained. Before the closure of the 1$^{st}$ ML of 2D materials, the coexistence of big and small 1$^{st}$ ML crystals, and also 2$^{nd}$ ML crystals on top of the 1$^{st}$ ML crystals can be observed. This is illustrated in FIG. 7. The left image in FIG. 7 shows an example of MOCVD WS$_2$ crystals grown on a SiO$_2$/Si surface. The dashed circles outline the small crystals grown on SiO$_2$/Si and the first ML WS$_2$ crystals. These small 1$^{st}$ ML and 2$^{nd}$ ML crystals can introduce more grain boundaries and local defects, which should be avoided during the deposition process. Therefore, in embodiments of the present disclosure, a process is introduced including cycles of deposition and selective etching to remove the small crystals (the superficial islands) and then regrow the layer until the 1$^{st}$ ML closes. Through tuning the etching parameters, the etching selection ratio (SE$_{etch}$) can be tuned. The etching selection ratio can be expressed as:

$$SE_{etch} = \frac{[W]_{2^{nd}ML}}{[W]_{1^{st}ML}}$$

In this equation, [W]$_{2^{nd}ML}$ represents the amount of material to be removed, while [W]$_{1^{st}ML}$ represents the amount of material to be kept. When SE$_{etch}$ is close to zero, there are big and small MX$_2$ crystals existing simultaneously, as shown in the inset schematic 310 in the right graph of FIG. 7. When SE$_{etch}$ increases, the small crystals are expected to be removed through etching and just the large crystals are left, as shown in the inset schematic 320 in the right graph of FIG. 7. In embodiments of the present disclosure, with increasing number of cycles of the deposition and selective etching process, the uniformity of the film increases. Thus, a uniform and wafer-scale single (or highly) crystalline 1 ML film can be obtained. In embodiments of the method of the present disclosure, a multi-ML film of 2D materials with a controlled NOML can be beneficially obtained.

A method according to embodiments of the present disclosure may be used for selective area deposition. In such a method, the provided 110 substrate can be a patterned substrate comprising a first material and a second material, and the at least one monolayer of the transition metal dichalcogenides is deposited 120 on the patterned substrate and the materials are selected such that the deposition is more inhibited on the second material than on the first material. Moreover, the high temperature etching 130 is such that nuclei of the transition metal dichalcogenides on the second material are removed from the second material.

In embodiments of the present disclosure, the transition metal dichalcogenide, the first material and the second material can be selected such that the deposition of the transition metal dichalcogenide is more inhibited on the second material than on the first material.

In an exemplary embodiment of the present disclosure, the first material of the patterned substrate can be, for example, HfO$_2$ and the second material SiO$_2$. In the deposition step, one monolayer of MX$_2$ can be selectively deposited on HfO$_2$ as the materials are selected such that the MX$_2$ deposition is more inhibited on SiO$_2$. However, a certain selectively loss can be expected with respect to SiO$_2$ resulting in the formation of MX$_2$ nuclei in the first monolayer also on SiO$_2$. In embodiments of the present disclosure, these are selectively removed from the SiO$_2$ surface using thermal etch process.

In an exemplary embodiment of the present disclosure, the first material can be MoS$_2$ and the second material SiO$_2$. The MX$_2$ material may be different from the first material. It may for example be WS$_2$, or HfS$_2$. The MX$_2$ material can be selectively deposited on the first material MoS$_2$ to form a heterostructure. The thermal etch process can be used to selectively etch MX$_2$ layer that nucleates on the second material SiO$_2$ to have the MX$_2$ layer only forming on the first material. As such, one can deposit heterostructure of MoS$_2$ with another MX$_2$ layer (e.g., WS$_2$, HfS$_2$).

In embodiments of the present disclosure, the method may comprise transferring the provided film from the substrate on which it is formed to a target substrate.

The transfer may be achieved via wet or dry transfer methods. In the wet transfer case, it may be based on water assisted delamination. A layer of PMMA may for example be firstly coated on the MX$_2$ film grown on sapphire. Then a thermal release tape (TRT) may be used for the transfer of the MX$_2$ from sapphire to other substrates. The MX$_2$ film may be delaminated from the sapphire through water intercalation in ambient. After transferring the TRT/PMMA/MX$_2$ on the target substrate (e.g. SiO$_2$), the TRT can be released at ~150° C. Finally, the PMMA may be removed through acetone and Isopropyl alcohol, which results in the clean MX$_2$ film on the target substrates.

The invention claimed is:

1. A method for providing a film of one or more monolayers of transition metal dichalcogenides on a substrate, the method comprising:
  providing a substrate;
  depositing at least one monolayer of the transition metal dichalcogenides on the substrate; and
  selectively removing superficial islands on top of the at least one monolayer by thermal etching with Cl$_2$ as etchant, wherein the selective removing step is performed at a temperature of at least 500° C.

2. The method according to claim 1 wherein the depositing and selectively removing steps are executed at least twice.

3. The method according to claim 1, wherein the transition metal dichalcogenides are deposited by metal-organic chemical vapor deposition.

4. The method according to claim 1, wherein the substrate is a sapphire substrate.

5. The method according to claim 1, wherein the transition metal dichalcogenide is MoS$_2$.

6. The method according to claim 1, wherein the depositing and selective removing steps are performed in a same reactor.

7. The method according to claim 1, wherein:
  the substrate is a patterned substrate comprising a first material and a second material;
  the at least one monolayer of the transition metal dichalcogenides is deposited on the patterned substrate and the first and second materials are selected such that the deposition is more inhibited on the second material than on the first material; and
  the thermal etching is such that nuclei of the transition metal dichalcogenides on the second material are removed from the second material.

8. The method according to claim 1, wherein the transition metal is a metal from group VI of the periodic table of elements.

* * * * *